(12) United States Patent
Liu et al.

(10) Patent No.: US 11,437,292 B2
(45) Date of Patent: Sep. 6, 2022

(54) SEMICONDUCTOR PACKAGE DEVICE AND METHOD OF MANUFACTURING THE SAME

(71) Applicant: Advanced Semiconductor Engineering, Inc., Kaohsiung (TW)

(72) Inventors: Wei-Wei Liu, Kaohsiung (TW); Huei-Siang Wong, Kaohsiung (TW); Lu-Ming Lai, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/599,772

(22) Filed: Oct. 11, 2019

(65) Prior Publication Data

US 2021/0111083 A1  Apr. 15, 2021

(51) Int. Cl.
*H01L 23/31* (2006.01)
*H01L 25/00* (2006.01)
*H01L 23/00* (2006.01)

(52) U.S. Cl.
CPC .......... *H01L 23/3114* (2013.01); *H01L 24/48* (2013.01); *H01L 25/50* (2013.01)

(58) Field of Classification Search
CPC . H01L 23/3114; H01L 23/3157; H01L 24/48; H01L 24/85; H01L 25/50; H01L 2224/04042; H01L 2224/8592
USPC ....................................................... 257/734
See application file for complete search history.

(56) References Cited

U.S. PATENT DOCUMENTS

| | | | | |
|---|---|---|---|---|
| 6,399,418 B1 * | 6/2002 | Glenn | .................... | H01L 21/561 257/E23.069 |
| 6,492,699 B1 * | 12/2002 | Glenn | ............... | H01L 27/14618 257/433 |
| 6,629,633 B1 * | 10/2003 | Glenn | ............... | H01L 27/14618 228/175 |
| 7,402,453 B2 * | 7/2008 | Derderian | ......... | H01L 27/14618 438/64 |
| 7,616,250 B2 * | 11/2009 | Watanabe | ......... | H01L 27/14618 257/432 |
| 7,638,887 B2 * | 12/2009 | Tsao | .................. | H01L 27/14683 257/787 |
| 7,834,926 B2 * | 11/2010 | Minamio | .......... | H01L 27/14685 348/340 |
| 8,647,963 B2 | 2/2014 | Lee et al. | | |
| 9,905,722 B1 * | 2/2018 | Chen | ....................... | G01S 17/04 |
| 9,960,094 B2 * | 5/2018 | Schwab | .................. | H01L 24/06 |
| 2013/0069176 A1 * | 3/2013 | Daamen | ................ | H01L 21/565 257/414 |

(Continued)

FOREIGN PATENT DOCUMENTS

CN    101964311 B    3/2014

*Primary Examiner* — Dao H Nguyen
(74) *Attorney, Agent, or Firm* — Foley & Lardner LLP

(57) ABSTRACT

A sensing module, a semiconductor device package and a method of manufacturing the same are provided. The sensing module includes a sensing device, a first protection film and a second protection film. The sensing device has an active surface and a sensing region disposed adjacent to the active surface of the sensing device. The first protection film is disposed on the active surface of the sensing device and fully covers the sensing region. The second protection film is in contact with the first protection film and the active surface of the sensing device.

15 Claims, 6 Drawing Sheets

(56) References Cited

U.S. PATENT DOCUMENTS

2018/0090530 A1* 3/2018 Jeong ................ H01L 27/14618
2018/0331007 A1* 11/2018 Nenadovic .......... H01L 23/3107

* cited by examiner

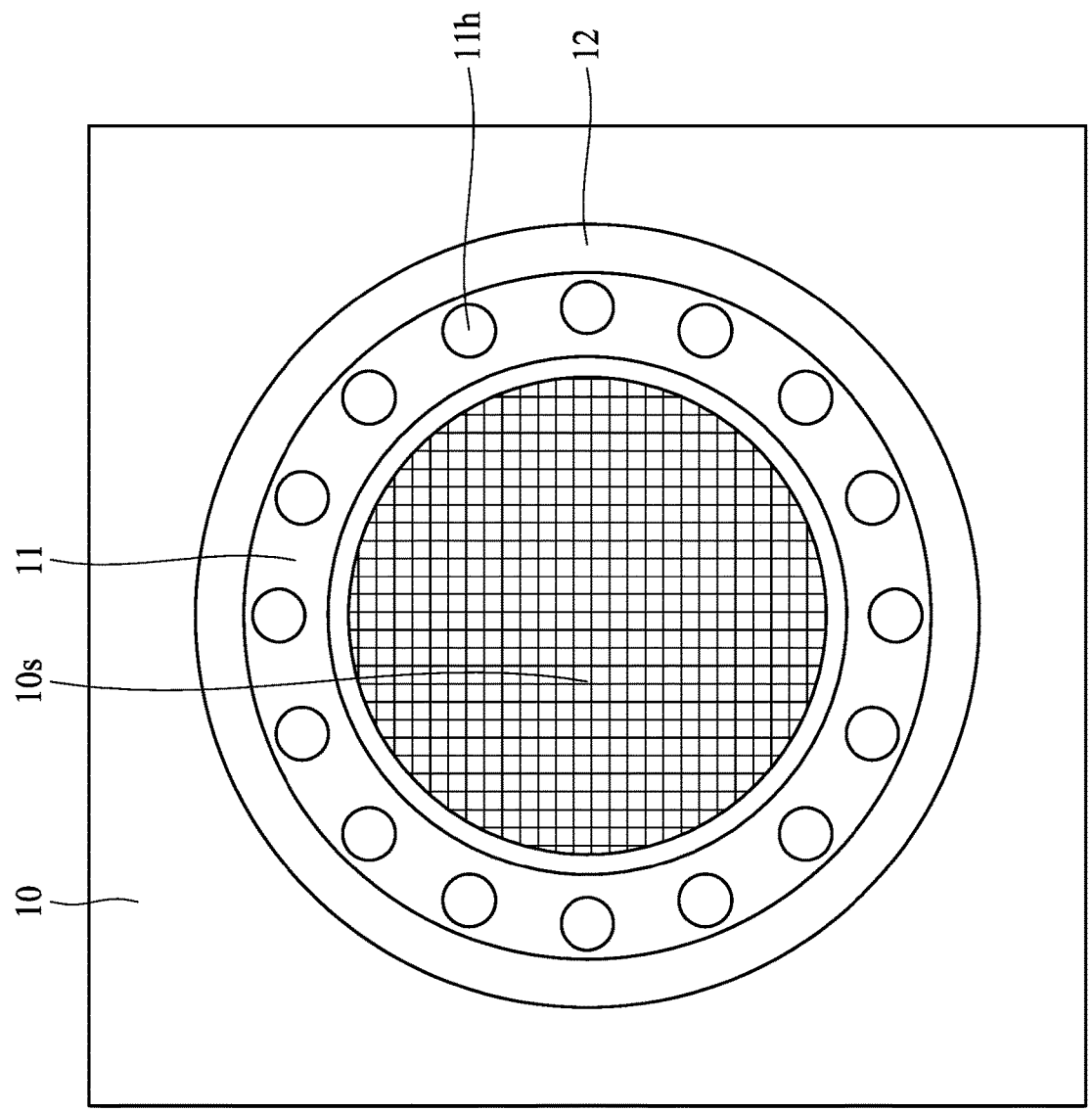

SEMICONDUCTOR PACKAGE DEVICE AND METHOD OF MANUFACTURING THE SAME

BACKGROUND

1. Technical Field

The present disclosure relates to a semiconductor package device, and more particularly, to a semiconductor package device including a sensing device.

2. Description of the Related Art

Sensing devices (e.g., sensors or microelectromechanical systems, MEMS) are widely used in many applications. In general, a sensing device has a sensing region to detect or receive environment information (e.g., sound, pressure, temperature, humidity, gas or the like). However, the sensing region is sensitive to the environment, and the detected information may be affected. Hence, it is desirable to reduce the error or offset of the information detected by the sensing device.

SUMMARY

In some embodiments, according to an aspect of the present disclosure, a sensing module includes a sensing device, a first protection film and a second protection film. The sensing device has an active surface and a sensing region disposed adjacent to the active surface of the sensing device. The first protection film is disposed on the active surface of the sensing device and fully covers the sensing region. The second protection film is in contact with the first protection film and the active surface of the sensing device.

In some embodiments, according to another aspect of the present disclosure, a semiconductor device package includes a substrate, sensing device, a first protection film and a second protection film. The sensing device is disposed on the substrate. The sensing device has an active surface facing away from the substrate and a sensing region disposed adjacent to the active surface of the sensing device. The first protection film is disposed on the active surface of the sensing device and fully covering the sensing region. The second protection film is in contact with the first protection film and the active surface of the sensing device.

In some embodiments, according to another aspect of the present disclosure, a method of manufacturing an electronic module includes (a) providing a sensing device, the sensing device having an active surface and a sensing region disposed adjacent to the active surface of the sensing device; (b) forming a first protection film on the active surface of the sensing device to fully cover the sensing region of the sensing device; and (c) forming a second protection film in contact with a portion of the first protection film and the active surface of the sensing device.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

FIG. 3B illustrates a top view of a sensing module in accordance with some embodiments of the present disclosure.

Figure 1A:
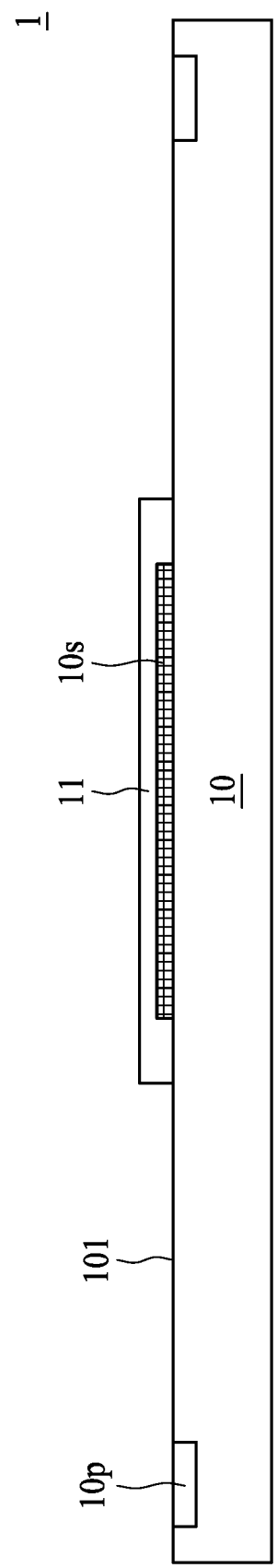
FIG. 1A illustrates a cross-sectional view of a sensing module in accordance with some embodiments of the present disclosure.

Common reference numerals are used throughout the drawings and the detailed description to indicate the same or similar components. The present disclosure can be best understood from the following detailed description taken in conjunction with the accompanying drawings.

DETAILED DESCRIPTION

Figure 1B:
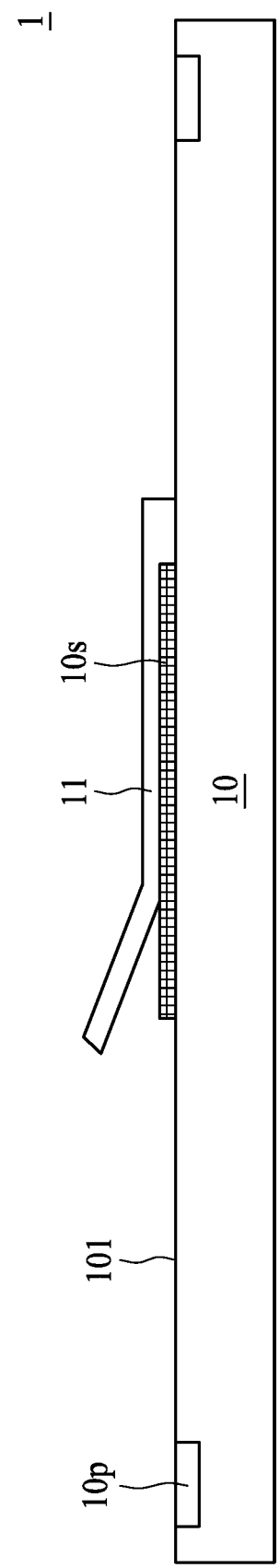
FIG. 1B illustrates a cross-sectional view of a sensing module in accordance with some embodiments of the present disclosure.

FIG. 1A and FIG. 1B illustrate cross-sectional views of a sensing module 1 in accordance with some embodiments of the present disclosure. The sensing module 1 includes a sensing device 10 and a protection film 11.

The sensing device 10 has an active surface 101 and a sensing region 10s disposed on or adjacent to the active surface 101 of the sensing device 10. The sensing region 10s of the sensing device 10 is configured to receive or detect at least one signal/information (e.g., sound, pressure, temperature, humidity, gas, or the like) from environment. The sensing device 10 may be or include a semiconductor die or chip. In some embodiments, the sensing device 10 may be or include a sensor or MEMS. In some embodiments, the sensing device 10 may be or include, for example, a pressure sensor, a microphone, a barometer, a thermometer, a hygrometer, a gas detector or the like. The sensing device 10 may include one or more conductive pads 10p in proximity to, adjacent to, or embedded in and exposed at the active surface 101 of the sensing device 10.

The protection film 11 is disposed on at least a portion of the active surface 101 of the sensing device 10. For example, the protection film 11 fully covers the sensing region 10s of the sensing device 10 and exposes the other portion (e.g., the conductive pads 10p) of the active surface 101 of the sensing device 10. In some embodiments, the protection film 11 is attached to the active surface 101 of the sensing device 10 to protect the sensing region 10s, which would prevent the sensing region 10s from being damaged or polluted. In some embodiments, the protection film 11 includes materials that would not affect the performance of the sensing device 10. For example, the protection film 11 may be a passivation film including hydrophobic materials. However, such protection film 11 has a relatively poor connection with respect to the active surface 101 of the sensing device 10. Therefore, the edge of the protection film 11 may peel off or detach from the active surface 101 of the sensing device 10, which would reduce the yield rate (e.g., about 30%) of the sensing device 10.

Figure 2:
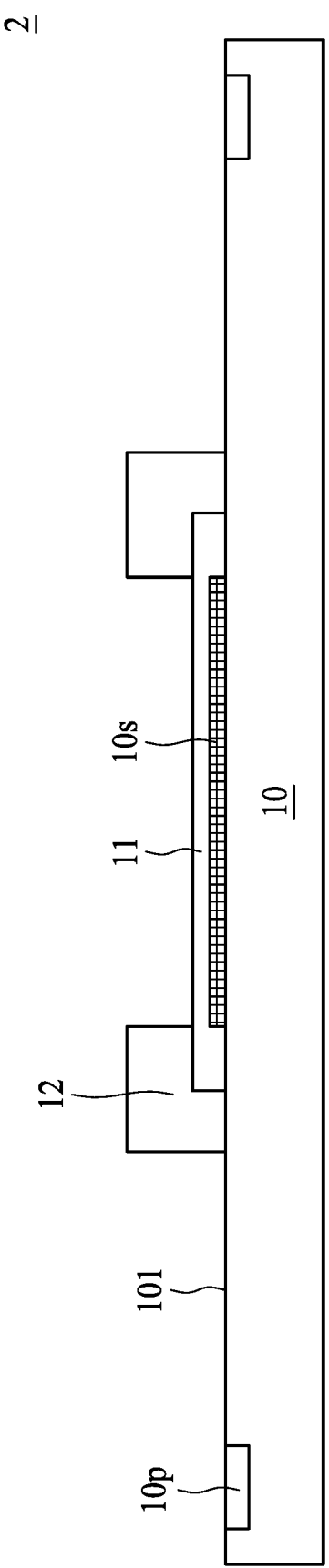
FIG. 2 illustrates a cross-sectional view of a sensing module in accordance with some embodiments of the present disclosure.

FIG. 2 illustrates a cross-sectional view of a sensing module 2 in accordance with some embodiments of the present disclosure. The sensing module 2 is similar to the sensing module 1 as shown in FIG. 1A, except that the sensing module 2 further includes a protection film 12.

The protection film 12 is disposed on a portion of the protection film 11 and a portion of the active surface 101 of the sensing device 10. For example, the protection film 12 covers the portion of the protection film 11 that does not overlap the sensing region 10s of the sensing device 10. For example, the protection film 12 exposes a portion of the protection film 11 covering the sensing region 10s of the sensing device 10. For example, a projection of the protection film 12 on the active surface 101 of the sensing device 10 is spaced apart from a projection of the sensing region 10s on the active surface 101 of the sensing device 10. The protection film 12 exposes the conductive pads 10p. The protection film 12 directly contacts the portion of the protection film 11 and the portion of the active surface 101 of the sensing device 10.

In some embodiments, the protection film 12 and the protection film 11 include different materials. In some embodiments, a bonding strength between the protection film 12 and the active surface 101 of the sensing device 10 is greater than a bonding strength between the protection film 11 and the active surface 101 of the sensing device 10. In some embodiments, the protection film 12 is formed of or includes a material including hydroxyl. In some embodiments, the protection film 12 is formed of or includes a material that is suitable for exposure and development processes. In some embodiments, the protection film 12 is a passivation film or a dielectric film. In some embodiments, the protection film 12 includes polyimide (PI), polybenzoxazole (PBO) or benzocyclobutene (BCB). By pressing or fixing the protection film 11 on the active surface 101 of the sensing device 10 using the protection film 12 having a relatively strong connection with respect to the active surface 101 of the sensing device 10, the issue of peeling off/detach of the protection film 11 as shown in FIG. 1B can be eliminated. This would significantly increase the yield rate of the sensing device 10.

Figure 3A:
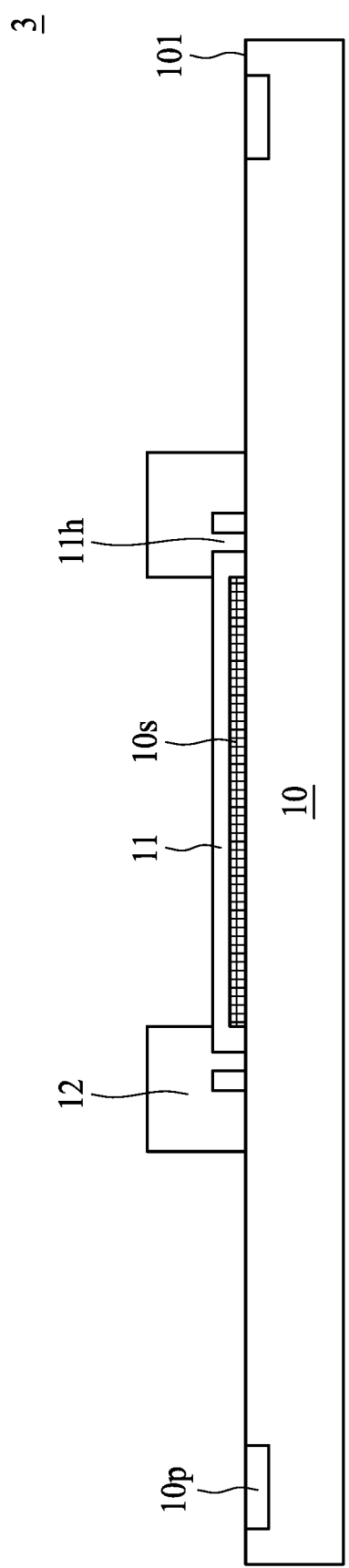
FIG. 3A illustrates a cross-sectional view of a sensing module in accordance with some embodiments of the present disclosure.

FIG. 3A illustrates a cross-sectional view of a sensing module 3 in accordance with some embodiments of the present disclosure. The sensing module 3 is similar to the sensing module 2 as shown in FIG. 2, and the differences therebetween are described below.

The protection film 11 has one or more openings 11h to expose the active surface 101 of the sensing device 10. The openings 11h are filled with the protection film 12. For example, the protection film 12 further extends within the openings 11h and directly contacts the active surface 101 of the sensing device 10 exposed from the openings 11h. In some embodiments, the protection film 11 and the protection film 12 define a lock structure (e.g., an anchorage lock). Hence, the connection between the protection film 12 and the active surface 101 of the sensing device 10 is stronger than the connection between the protection film 12 and the active surface 101 of the sensing device 10 as illustrated in FIG. 2. This would further increase the yield rate (about 100%) of the sensing device 10.

FIG. 3B illustrates a top view of the sensing module 3 as shown in FIG. 3A, in accordance with some embodiments of the present disclosure. As shown in FIG. 3B, the protection film 11 includes a plurality of openings 11h separated from each other. In some embodiments, the number, the size and the shape of the openings and the distance between two adjacent openings can be adjusted or changed depending on different design specifications. In some embodiments, the openings 11h surround the sensing region 10s of the sensing device 10. The openings 11h are spaced apart from the sensing region 10s of the sensing device 10.

Figure 4:
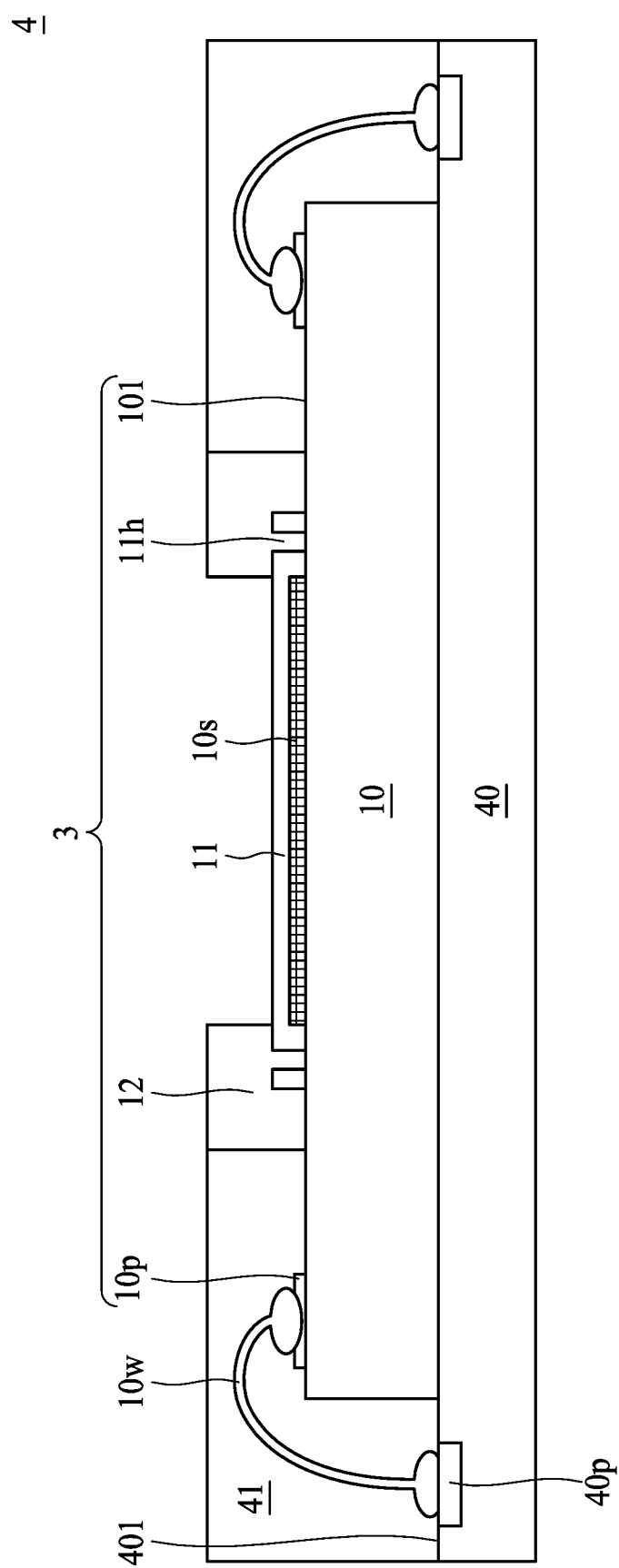
FIG. 4 illustrates a cross-sectional view of a semiconductor device package in accordance with some embodiments of the present disclosure.

FIG. 4 illustrates a cross-sectional view of a semiconductor device package 4 in accordance with some embodiments of the present disclosure. The semiconductor device package 4 includes a substrate 40, a package body 41 and the sensing module 3 as shown in FIG. 3A. In other embodiments, the sensing module 3 of the semiconductor device package 4 can be replaced by the sensing module 1 in FIG. 1A or the sensing module 2 in FIG. 2 depending on different design specifications.

The substrate 40 may be, for example, a printed circuit board, such as a paper-based copper foil laminate, a composite copper foil laminate, or a polymer-impregnated glass-fiber-based copper foil laminate. The substrate 40 may include an interconnection structure, such as a redistribution layer (RDL) or a grounding element. In some embodiments, the substrate 40 may be a single-layer substrate or multi-layer substrate which includes a core layer and a conductive material and/or structure. The conductive material and/or structure may include a plurality of traces. The substrate 40 may include one or more conductive pads 40p in proximity to, adjacent to, or embedded in and exposed at a surface 401 of the substrate 40. The substrate 40 may include a solder resist (or solder mask) on the surface 401 of the substrate 40 to fully expose or to expose at least a portion of the conductive pads 40p for electrical connections. For example, the solder resist may cover a portion of the conductive pads 10p.

The sensing module 3 is disposed on the surface 401 of the substrate 40. The active surface 101 of the sensing device 10 faces away from the surface 401 of the substrate 40. The conductive pads 10p of the sensing device 10 are electrically connected to the conductive pads 40p of the substrate 40 through bonding wires 10w.

The package body 41 is disposed on the surface 401 of the substrate 40 and a portion of the active surface 101 of the sending device 10 exposed from the protection film 11 and/or the protection film 12. The package body 41 covers or encapsulates the portion of the active surface 101 of the sending device 10, bonding wires 10w and the substrate 40. In some embodiments, the package body 41 includes an epoxy resin having fillers, a molding compound (e.g., an epoxy molding compound or other molding compound), a polyimide, a phenolic compound or material, a material with a silicone dispersed therein, or a combination thereof.

Figure 5A:
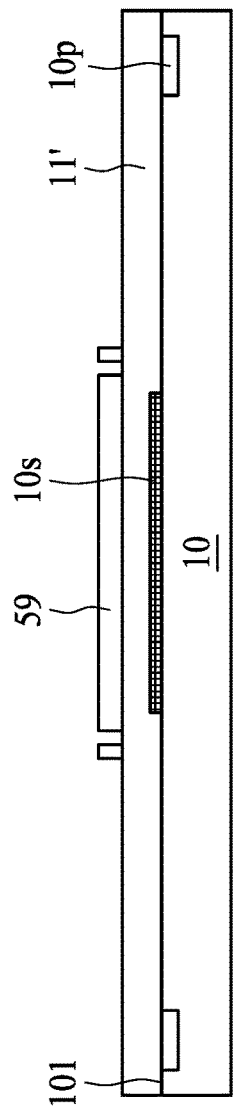
FIG. 5A, FIG. 5B and FIG. 5C illustrate one or more stages of a sensing module manufacturing process, according to some embodiments of the present disclosure.
Figure 5B:
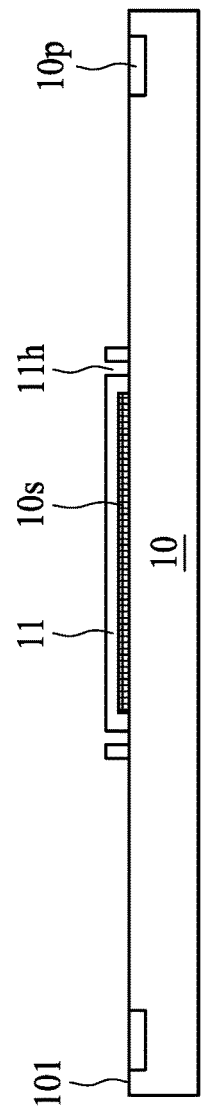
Figure 5C:
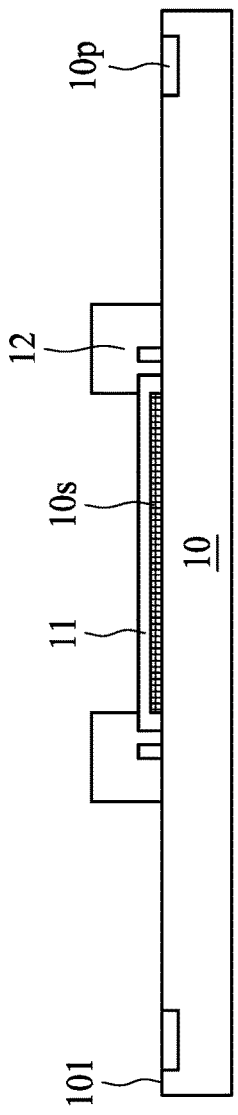

FIG. 5A, FIG. 5B and FIG. 5C illustrate various stages of a sending module manufacturing process, according to some embodiments of the present disclosure. In some embodiments, the operations illustrated in FIG. 5A, FIG. 5B and FIG. 5C can be used to manufacture the sending module 3 as shown in FIG. 3A. Alternatively, the operations illustrated in FIG. 5A, FIG. 5B and FIG. 5C can be used to manufacture other sensing modules.

Referring to FIG. 5A, a sensing device 10 is provided. A protection film 11' is placed on or attached to an active surface 101 of the sensing device 10 to cover the active surface 101 (including the sensing region 10s and the conductive pads 10p) of the sensing device 10. A patterned mask 59 is then disposed on the protection film 11'. The patterned mask 59 is located over the sensing region 10s of the sensing device 10 and over the positions adjacent to the edge of the sensing region 10s of the sensing device 10.

Referring to FIG. 5B, a portion of the protection film 11' is removed to form the protection film 11. In some embodiments, the portion of the protection film 11' can be removed by, for example, a lithographic operation (e.g., exposure and development processes). The protection film 11 has a plurality of openings 11h to expose the active surface 101 of the sensing device 10.

Referring to FIG. 5C, a protection film 12 is formed on a portion of the active surface 101 of the sensing device 10. The protection film 12 is formed on a portion of the protection film 11. The protection film 12 is formed within the openings 11h and directly contacts the active surface 101 of the sensing device 10 exposed from the openings 11h. In some embodiments, the protection film 12 can be formed by the processes similar to that for forming the protection film 11.

In the description of some embodiments, a component provided "on" another component can encompass cases where the former component is directly on (e.g., in physical contact with) the latter component, as well as cases where one or more intervening components are located between the former component and the latter component.

In the description of some embodiments, a component characterized as "light transmitting" or "transparent" can refer to such a component as having a light transmittance of at least 80%, such as at least 85% or at least 90%, over a relevant wavelength or a relevant range of wavelengths, such as a peak infrared wavelength or a range of infrared wavelengths emitted by a light emitter. In the description of some embodiments, a component characterized as "light shielding," "light blocking," or "opaque" can refer to such a component as having a light transmittance of no greater than 20%, such as no greater than 15% or no greater than 10%, over a relevant wavelength or a relevant range of wavelengths, such as a peak infrared wavelength or a range of infrared wavelengths emitted by a light emitter.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

While the present disclosure has been described and illustrated with reference to specific embodiments thereof, these descriptions and illustrations do not limit the present disclosure. It will be clearly understood by those skilled in the art that various changes may be made, and equivalents may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it should be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. An electronic module, comprising:
a sensing device having a first surface and a sensing region disposed adjacent to the first surface of the sensing device;
a first protection film disposed on the first surface of the sensing device and covering the sensing region, wherein the first protection film includes a plurality of openings arranged adjacent and along a periphery of the sensing region of the sensing device to expose a portion of the first surface of the sensing device; and
a second protection film directly covering the portion of the first surface of the sensing device exposed from the openings,
wherein the plurality of openings are free from external connection elements.

2. The electronic module of claim 1, further comprising a package body contacting the second protection film, wherein the second protection film laterally extends away from the first protection film.

3. The electronic module of claim 2, wherein the first surface of the sensing device includes a conductive pad connecting a conductive wire, wherein the package body covers the conductive pad and the conductive wire.

4. The electronic module of claim 3, wherein an interface of the package body and the second protection film is located between an edge of the first protection film and the conductive pad.

5. The electronic module of claim 1, wherein the second protection film includes a material having a bonding strength with respect to the sensing device greater than a bonding strength of a material of the first protection film with respect to the sensing device.

6. The electronic module of claim 1, wherein a projection of the openings of the first protection film on the first surface of the sensing device is spaced apart from the sensing region of the sensing device.

7. The electronic module of claim 1, wherein the second protection film covers the upper surface of the first protection film.

8. The electronic module of claim 1, wherein the second protection film covers a lateral surface of the first protection film.

9. The electronic module of claim 1, wherein the second protection film has an upper surface higher than an upper surface of the first protection film.

10. The electronic module of claim 1, wherein the second protection film is disposed within the openings of the first protection film and in contact with the portion of the first surface exposed from the first protection film.

11. The electronic module of claim 1, wherein the first protection film has a first side contacting the sensing region and a second side contacting the second protection film.

12. A semiconductor device package, comprising
a sensing device having a first surface and a sensing region disposed adjacent to the first surface of the sensing device;
a first protection film disposed on the first surface of the sensing device and covering the sensing region, wherein the first protection film includes a plurality of openings to expose a portion of the first surface of the sensing device;
a second protection film disposed on the first surface of the sensing device and a peripheral portion of an upper surface of the first protection film; and
a package body covering a portion of the first surface of the sensing device and contacting the second protection film,
wherein the second protection film includes an opening to expose the sensing region of the sensing device, and the second protection film is disposed within the openings of the first protection film and in contact with the portion of the first surface exposed from the first protection film, wherein the first surface of the sensing device includes a conductive pad connecting a conductive wire, wherein the package body covers the conductive pad and the conductive wire, and wherein the plurality of openings of the first protection film are free from the package body.

13. The semiconductor device package of claim 12, wherein the second protection film includes a material having a bonding strength with respect to the sensing device greater than a bonding strength of a material of the first protection film with respect to the sensing device.

14. The semiconductor device package of claim 12, wherein the second protection film covers a lateral surface of the first protection film.

15. An electronic module, comprising:
a sensing device having a first surface and a sensing region disposed adjacent to the first surface of the sensing device;
a first protection film disposed on the first surface of the sensing device and covering the sensing region, wherein the first protection film includes a plurality of openings arranged adjacent and along a periphery of the sensing region of the sensing device to expose a portion of the first surface of the sensing device;
a second protection film directly covering the portion of the first surface of the sensing device exposed from the openings;
a substrate adjacent to the sensing device;
a conductive wire connecting a conductive pad on the first surface of the sensing device to the substrate; and
a package body disposed on the substrate and covering a portion of the first surface of the sensing device exposed from the first protection film, the second protection film, and the conductive wire.

* * * * *